(12) United States Patent
Chen et al.

(10) Patent No.: US 8,917,104 B2
(45) Date of Patent: Dec. 23, 2014

(54) ANALYZING EM PERFORMANCE DURING IC MANUFACTURING

(75) Inventors: Fen Chen, Williston, VT (US); Roger A. Dufresne, Fairfax, VT (US); Kai D. Feng, Hopewell Junction, NY (US); Richard J. St-Pierre, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 13/222,306

(22) Filed: Aug. 31, 2011

(65) Prior Publication Data
US 2013/0049793 A1 Feb. 28, 2013

(51) Int. Cl.
*G01R 31/3187* (2006.01)
*G01R 31/28* (2006.01)

(52) U.S. Cl.
CPC .................................. *G01R 31/2858* (2013.01)
USPC .......................... 324/750.3; 324/525; 324/713

(58) Field of Classification Search
None
See application file for complete search history.

(56) References Cited

U.S. PATENT DOCUMENTS

| | | | |
|---|---|---|---|
| 4,739,258 A * | 4/1988 | Schwarz ........................ | 324/537 |
| 5,053,700 A | 10/1991 | Parrish | |
| 5,264,377 A | 11/1993 | Chesire et al. | |
| 5,485,095 A | 1/1996 | Bertsch et al. | |
| 5,497,076 A * | 3/1996 | Kuo et al. ................. | 324/762.02 |
| 5,514,974 A | 5/1996 | Bouldin | |
| 5,627,101 A | 5/1997 | Lin et al. | |
| 6,037,795 A | 3/2000 | Filippi et al. | |
| 6,136,619 A | 10/2000 | Ceuninck et al. | |
| 6,320,391 B1 * | 11/2001 | Bui ............................. | 324/537 |
| 6,614,251 B2 * | 9/2003 | Ootsuji ..................... | 324/762.01 |
| 6,683,465 B2 | 1/2004 | Fetterman et al. | |
| 6,724,214 B2 | 4/2004 | Manna et al. | |
| 7,102,445 B2 * | 9/2006 | Yamazaki et al. ............. | 330/298 |
| 7,339,390 B2 | 3/2008 | Cranford, Jr. et al. | |
| 7,394,273 B2 | 7/2008 | Hsu et al. | |
| 7,521,952 B2 | 4/2009 | Chanda et al. | |
| 7,683,651 B2 | 3/2010 | Chanda et al. | |
| 7,719,302 B2 * | 5/2010 | Hsu et al. .................. | 324/754.01 |
| 8,237,458 B2 | 8/2012 | Federspiel | |
| 8,253,423 B2 * | 8/2012 | Lee et al. ........................ | 324/537 |
| 2006/0267621 A1 * | 11/2006 | Harris et al. ................... | 324/765 |
| 2008/0217614 A1 | 9/2008 | Cranford et al. | |

FOREIGN PATENT DOCUMENTS

JP 58182237 10/1983

OTHER PUBLICATIONS

U.S. Appl. No. 13/282,090, Office Action, dated Apr. 29, 2014, 12 pages.
U.S. Appl. No. 13/282,090, Notice of Allowance, dated Jul. 14, 2014, 8 pages.

* cited by examiner

*Primary Examiner* — Richard Isla Rodas
(74) *Attorney, Agent, or Firm* — David A. Cain; Hoffman Warnick LLC

(57) ABSTRACT

A testing structure, system and method for monitoring electro-migration (EM) performance. A system is described that includes an array of testing structures, wherein each testing structure includes: an EM resistor having four point resistive measurement, wherein a first and second terminals provide current input and a third and fourth terminals provide a voltage measurement; a first transistor coupled to a first terminal of the EM resistor for supplying a test current; the voltage measurement obtained from a pair of switching transistors whose gates are controlled by a selection switch and whose drains are utilized to provide a voltage measurement across the third and fourth terminals. Also included is a decoder for selectively activating the selection switch for one of the array of testing structures; and a pair of outputs for outputting the voltage measurement of a selected testing structure.

19 Claims, 7 Drawing Sheets

ANALYZING EM PERFORMANCE DURING IC MANUFACTURING

BACKGROUND

The present invention relates to a measurement structure in a standard cell for controlling and monitoring process parameters for electro-migration (EM) performance during manufacturing of an integrated circuit (IC).

Electro-migration (EM) refers to mass transport due to the momentum exchange between conducting electrons and diffusing metal atoms in metallic interconnects. As integrated circuits become progressively more complex, the individual components must become increasingly more reliable if the reliability of the whole device is to be acceptable. However, due to continuing miniaturization of very large scale integrated (VLSI) circuits, thin film metallic conductors or interconnects are subject to increasingly high current densities. Under these conditions, EM can lead to an electrical failure of a product within a relatively short time, therefore reducing the product lifetime to an unacceptable level. More and more integrated circuit systems, especially for those circuits used in medical, military, and space applications, need an assurance of system reliability for their critical missions. Therefore, it is of great importance and critical need to evaluate EM during the manufacturing process to assure overall chip reliability.

EM reliability tests during integrated circuit (IC) manufacturing attempt to project future EM failures, i.e., the tests calculate "EM projections". Unfortunately, reliability of the tests is limited due to the approach used in conventional testing. For example, such tests are performed at extremely high temperatures (e.g., 300-400 degrees Celsius) in order to accelerate failure times of a very limited sample size (e.g., less than 100 samples per condition) at module level. Drawbacks of this approach include:

1) High temperatures could cause some competing degradation effects such as stress migration and low-k film material degradation;

2) Module (i.e., package) level test is costly as it requires, e.g., extra shipping, wafer dicing, cleaning, chiplet picking, wire bonding, baking, etc.; module level testing is also time consuming and prone to other damages, e.g., ESD, cracking, edge seal damages, etc.;

3) Modeling chip level EM from line level is not easy and needs a careful mathematical transformation (chip level EM is not Lognormal distributed); and 4) Confidence bounds of projection based on limited sample size are typically poor and multi-modal sub-group distributions cannot be easily separated from a limited sample size.

BRIEF SUMMARY

In a first aspect, the present invention provides a testing structure for monitoring electro-migration (EM) performance, comprising: an EM resistor having four point resistive measurement, wherein a first terminal and a second terminal provide current input and a third terminal and a fourth terminal provides a voltage measurement; and a first transistor coupled to the first terminal of the EM resistor as a secondary side of a current mirror for supplying a test current; wherein the voltage measurement is obtained from a pair of switching transistors whose gates are controlled by a selection switch and whose drains are utilized to measure a voltage across the third and fourth terminals.

In a second aspect, the invention provides a system for monitoring electro-migration (EM) performance, comprising: an array of testing structures, wherein each testing structure includes: an EM resistor having four point resistive measurement, wherein a first terminal and a second terminal provides current input and a third terminal and a fourth terminal provides a voltage measurement, the voltage measurement obtained from a pair of switching transistors whose gates are controlled by a selection switch and whose drains are utilized to measure a voltage across the third and fourth terminals; and a first transistor coupled to the first terminal of the EM resistor as a secondary side of a current mirror for supplying a test current; a decoder for selectively activating the selection switch for one of the array of testing structures; and a pair of outputs for outputting the voltage measurement of a selected testing structure.

In a third aspect, the invention provides a method for determining electro-migration (EM) reliability, comprising: providing a plurality of testing structures in an integrated circuit (IC), wherein each testing structure includes: an EM resistor having four point resistive measurement, wherein a first terminal and a second terminal provides current input and a third terminal and a fourth terminal provides a voltage measurement, the voltage measurement obtained from a pair of switching transistors whose gates are controlled by a selection switch and whose drains are utilized to measure a voltage across the third and fourth terminals; and a first transistor coupled to the first terminal of the EM resistor as a secondary side of a current mirror for supplying a test current; selectively activating the selection switch for each of the plurality of testing structures; and outputting the voltage measurement for each selected testing structure.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings.

Figure 1:
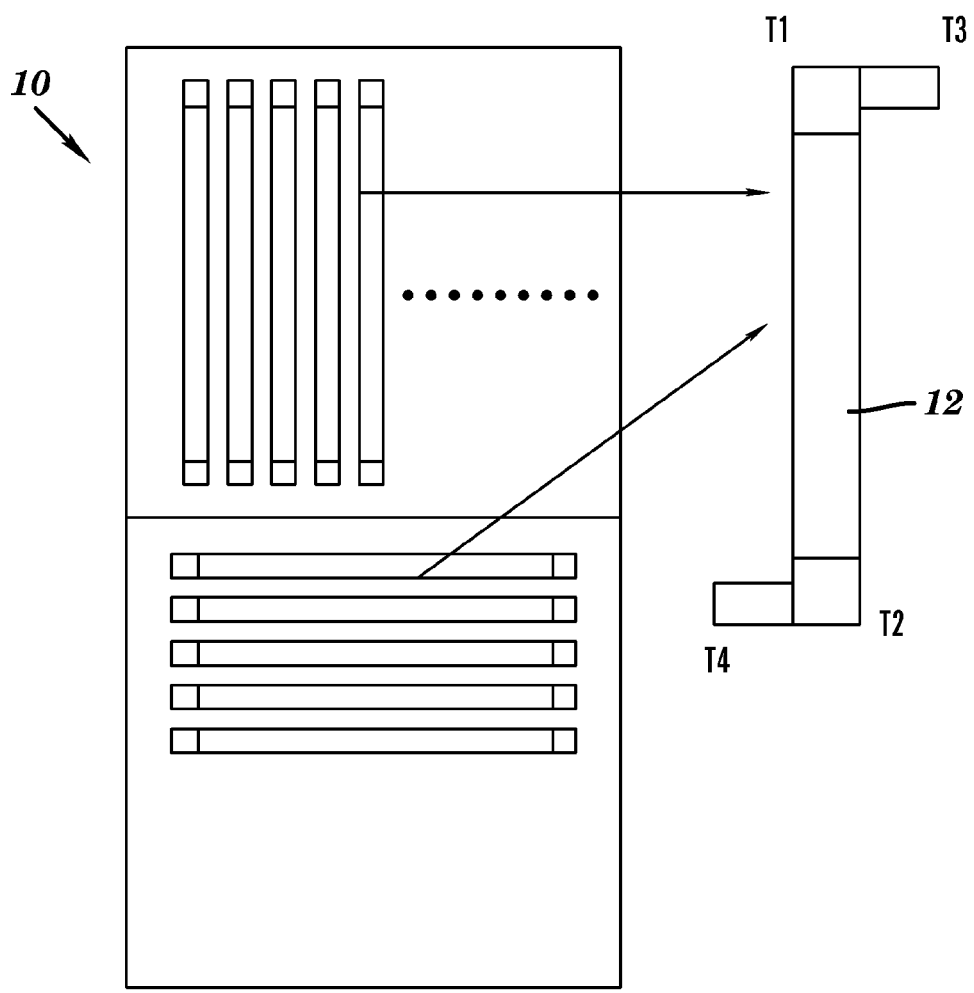
FIG. 1 depicts a layout view of four point resistors in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like reference numbering represents like elements.

DETAILED DESCRIPTION

The following embodiments include testing structures and methods for providing a reliable and highly accurate EM projection for an integrated circuit. The described solution utilizes a layout 10 of four point resistors 12 (also commonly referred to as "4-terminal resistors"), as shown in FIG. 1. Each resistor 12 includes an associated independent circuit to form an EM testing structure (cell) 14 shown in FIG. 2 for detecting resistance failures. In an illustrative embodiment, one million or so such structures 14 may be utilized and packaged in a relatively small area, e.g., 1 mm². Based on the occurrence of one or more failures during testing, an EM projection can be determined. For instance, a failure at time $T_F$ during testing can be transformed into a projected EM failure at time $P_F$.

Figure 2:
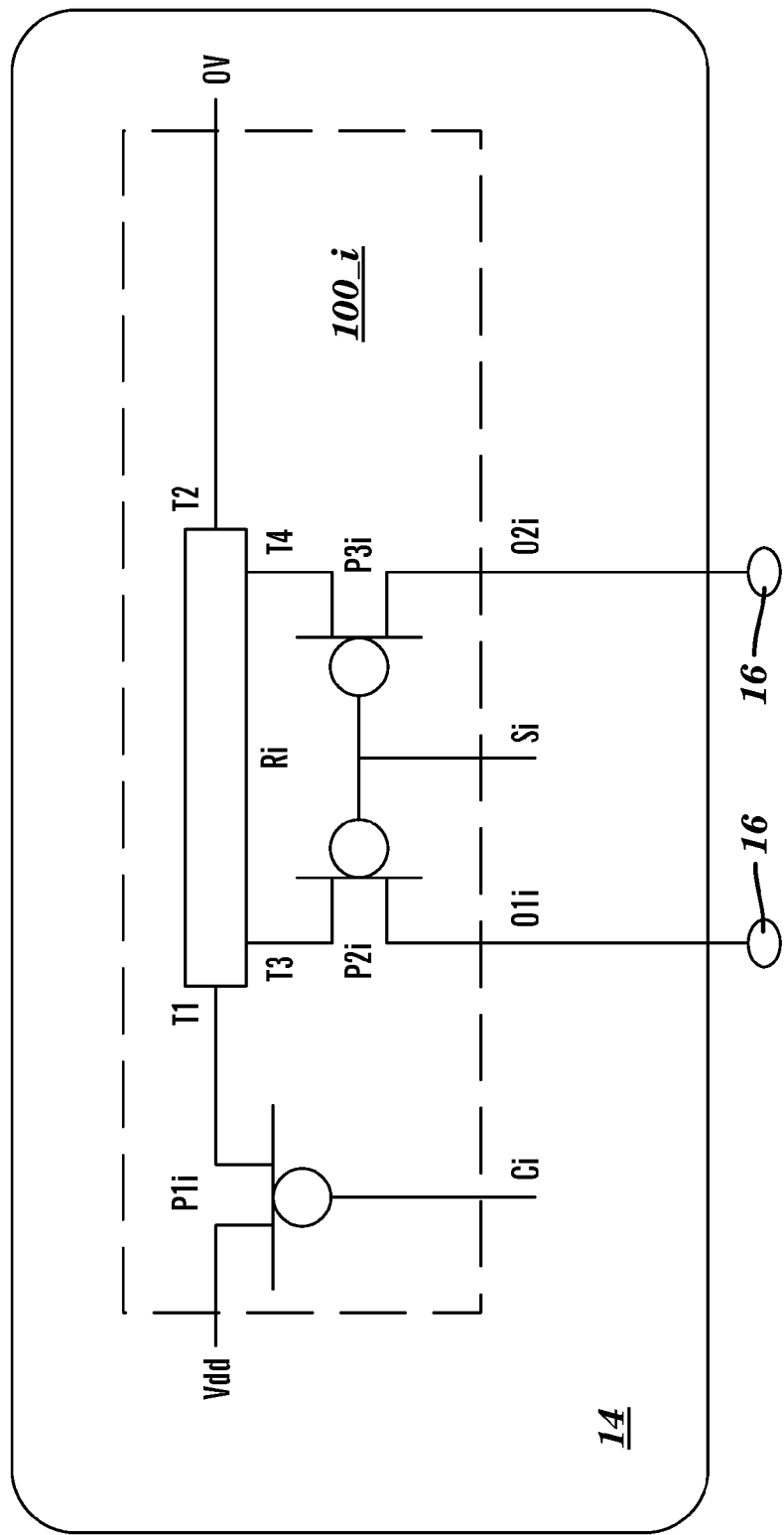
FIG. 2 depicts an EM testing structure in accordance with an embodiment of the present invention.

In the illustrative testing structure 14 shown in FIG. 2, resistor Ri includes terminals T1 and T2 that are used for current input and terminals T3 and T4 that are used for voltage measurement. A measurement switch comprising P2$i$ and P3$i$ is coupled to terminals T3 and T4. P1$i$ is a PFET (P-type field effect transistor) of the secondary side of a current mirror which provides the test current to resistor Ri. P2$i$ and P3$i$ are the switching PFETs and drains O1$i$ and O2$i$ of P2$i$ and P3$i$, respectively, are connected to two common voltage terminals, which can be used to measure the voltage cross the terminal T3 and terminal T4 of Ri. The gates of P2$i$ and P3$i$ are connected to the selection terminal, Si, and the sources are connected to terminals T3 and T4, respectively.

When the voltage on Si is at logic low, both P2$i$ and P3$i$ are turned on so the voltage across terminals T3 and T4 of Ri are connected to the output voltage terminals 16 of the system. Such voltages can be measured by either off chip or on-chip measurement units (not shown). Note that while testing structure 14 is shown implemented with PFETs, it is understood that the circuit could be implemented with any type or combination of transistors capable of performing the actions described herein, including PFETs, NFETs or bipolar transistors.

Figure 3:
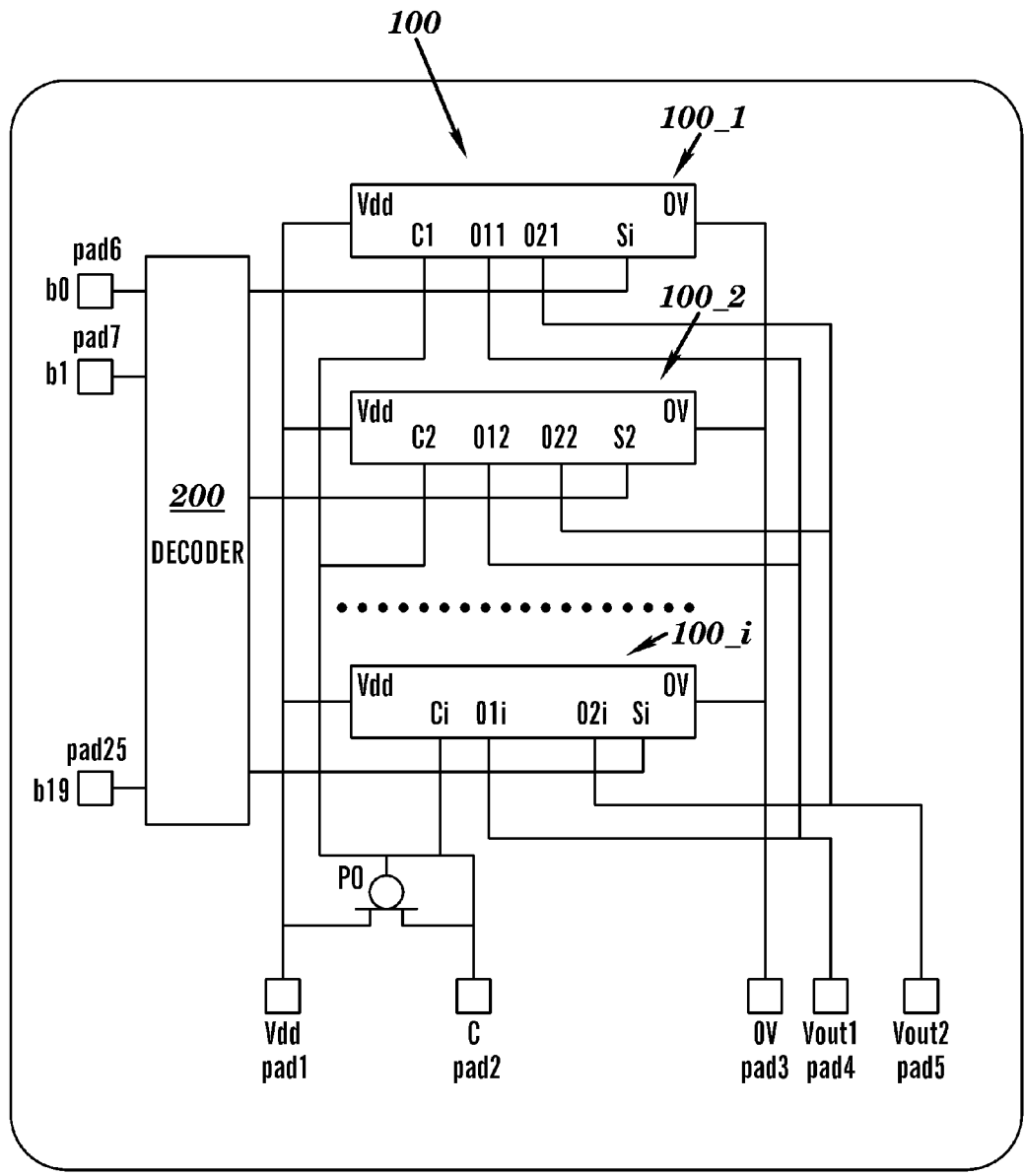
FIG. 3 depicts a testing array in accordance with an embodiment of the present invention.

FIG. 3 depicts an illustrative testing array 18 that comprises a plurality of testing structures 100 (i.e., 100_1, 100_2 . . . 100_i). The terminal Vdd of each testing structure 100 is connected to pad1. P0 is a PFET which forms the primary side of the current mirror for each testing structure 100; the secondary side being provided, e.g., by P1$i$ shown in FIG. 1. The gate and drain of P0 are connected to pad2 and terminals C1, C2, . . . Ci of each testing structure 100. Pad2 is further connected to a current source so that the current mirror mirrors the current of the current source to each testing structure 100 with a mirror ratio.

The terminal of 0V of each testing structure 100 is connected to pad3. The terminal O1 (i.e., O11, O12 . . . O1i) of each testing structure 100 is connected to pad4, Vout1. The terminal of O2 (i.e., O21, O22 . . . O2i) of each testing structure 100 is connected to pad5, Vout2. Each terminal S (S1, S2 . . . Si) is coupled to a decoder 200. The rest of the pads, i.e., pad6 to pad25 are utilized as the inputs of decoder, i.e., b0 to b19.

When a predetermined input code is applied to pads b0 to b19 of the decoder, one of the decoder outputs S is set at logic low. The output voltage of the corresponding testing structure 100 on the resistor under test is connected to pad4 of Vout1 and pad5 of Vout2. Because this embodiment utilizes a 20 bit input into the decoder 200, up to 1,048,576 testing structures 100 may be implemented to test the corresponding IC.

Figure 4:
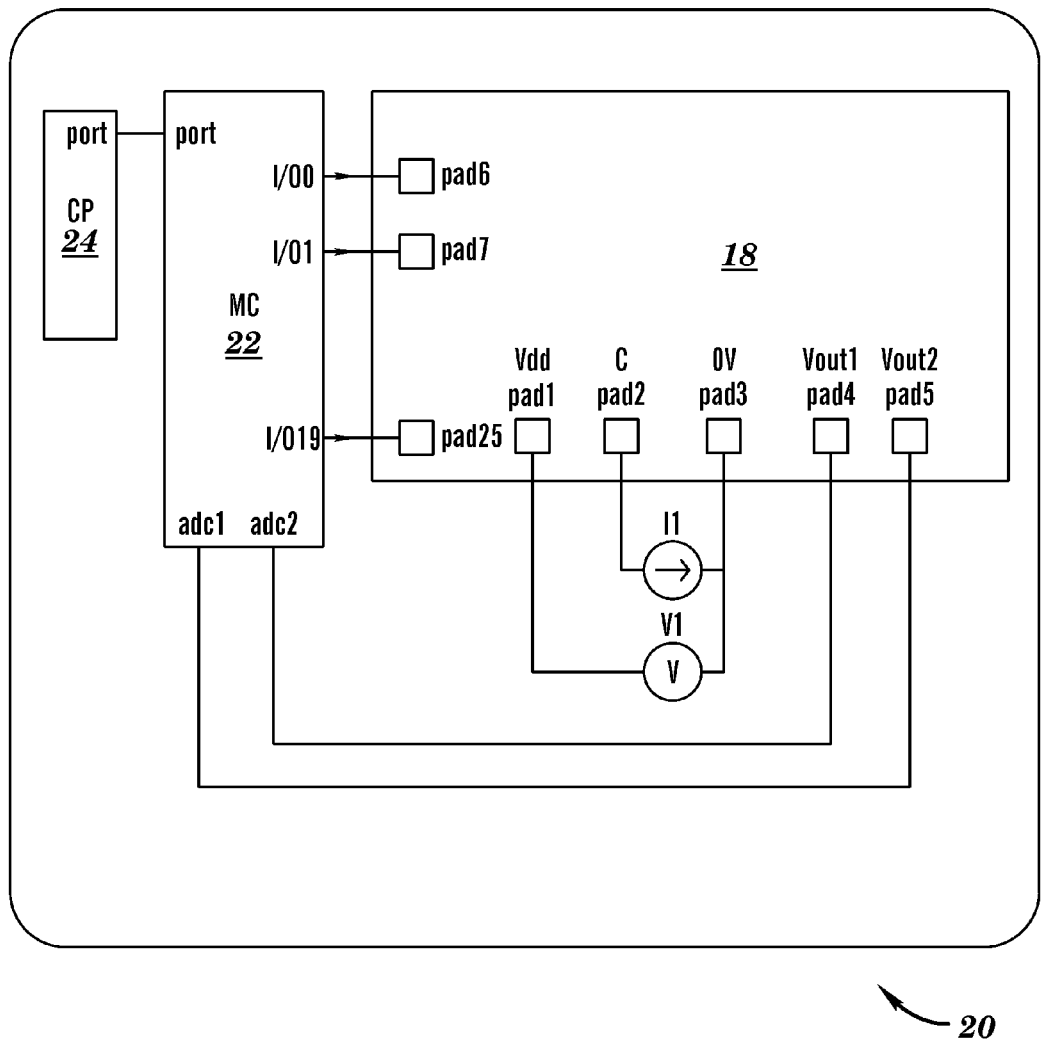
FIG. 4 depicts an externally controlled testing system in accordance with an embodiment of the present invention.

FIG. 4 depicts an illustrative on-chip array-based scanning system 20 for controlling the testing array 18 of FIG. 3. In this embodiment, testing array 18 is provided in which V1 is a voltage supply and I1 is a current source that provides the current to the current mirror. A microcontroller (MC) 22 is provided that includes two analog to digital converters (adc1 and adc2), and 20 input/output ports (I/O 0, I/O 1, . . . I/O 19). A communication port, e.g., a USB, connects the microcontroller 22 to a computer (CP) 24, such as a personal computer.

Figure 5:
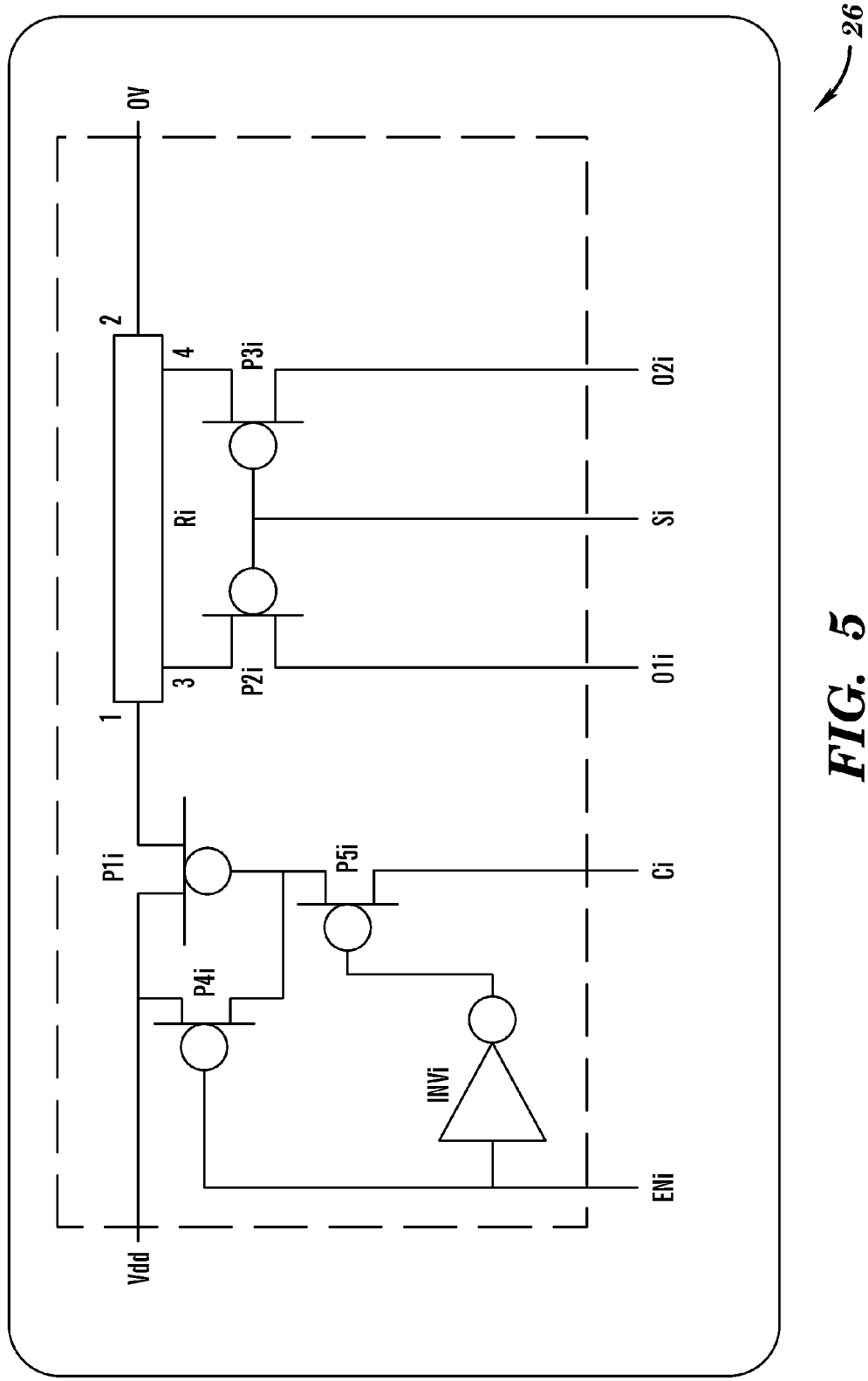
FIG. 5 depicts an alternative EM testing structure in accordance with an embodiment of the present invention.

FIG. 5 depicts an alternative embodiment of a testing structure 26 capable of testing for both resistance and leakage failures. In addition to PFETs P1$i$, P2$i$ and P3$i$ shown in FIG. 2, testing structure 26 includes two additional PFETs (P4$i$, P5$i$) and an inverter INV$i$, which causes P1$i$ to not always be on. When ENi is at logic high, P5$i$ is turned on, P4$i$ is turned off, P1$i$ is connected to the primary side of the current mirror. Also, since P1$i$ provides the current to the resistor Ri under test when Si is at logic low. P2$i$ and P3$i$ are turned on as well for the normal stress test. A stress test generally refers to operating a device under higher than usual voltage, current and/or temperature conditions to accelerate failure.

When ENi is at logic low, P5$i$ is turned off, P4$i$ is turned on, and P1$i$ is disconnected from the primary side of the current mirror. However Si is at logic low, so the leakage between two neighbor resistors (not shown) can be recorded. Note that testing structure 26 could be readily implemented using any type or combination of transistors capable of performing the actions described herein, including PFETs, NFETs or bipolar transistors.

Figure 6:
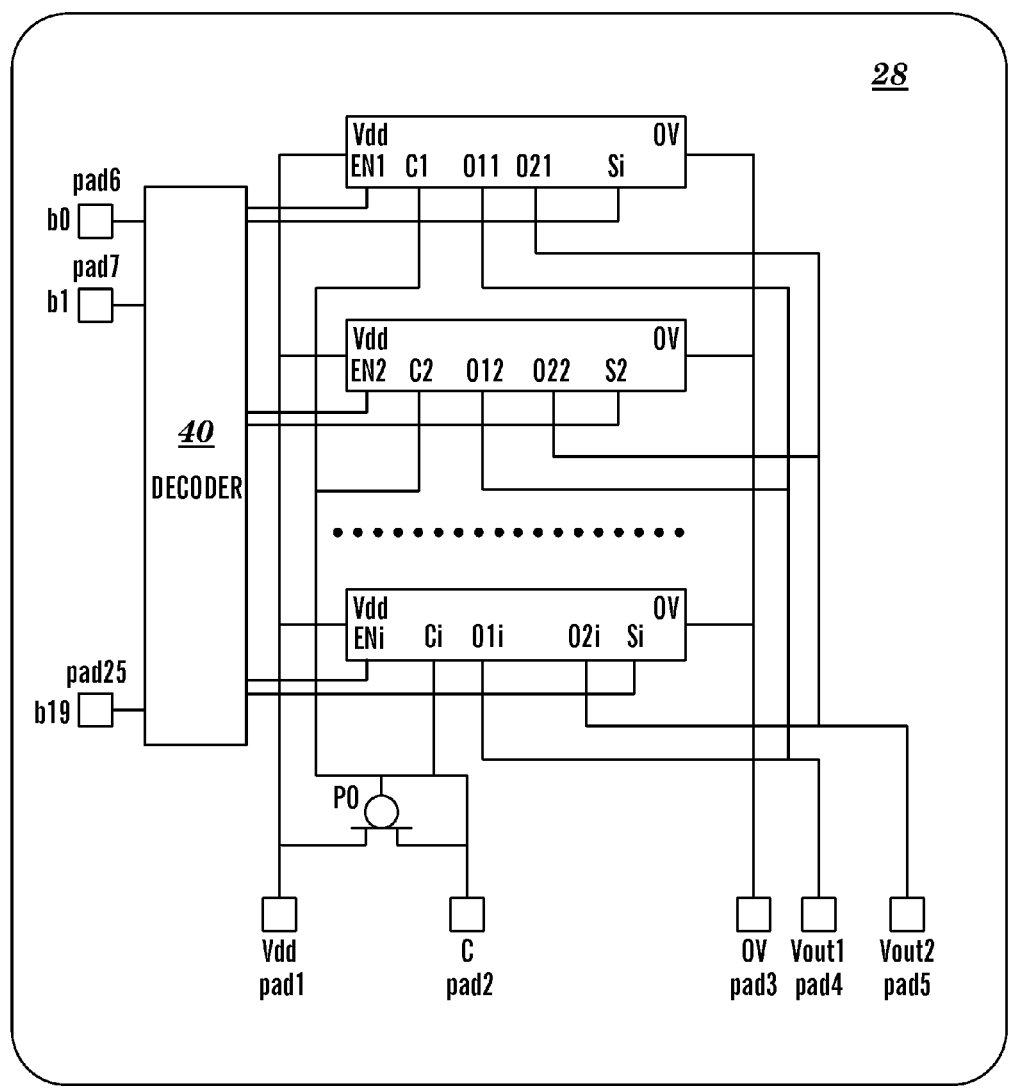
FIG. 6 depicts an alternative testing array in accordance with an embodiment of the present invention.

In the associated testing array 28 shown in FIG. 6, the decoder 400 has control signals for EN (i.e., EN1, EN2 . . . ENi) which can be turned to at logic high or logic low independently. When the leakage between neighboring resistors Rx and R(x+1) are tested, En(x−1) and Enx are at logic low, and En(x+1) is at logic high. Pad25 (b19) of decoder 400 can be use for the mode selection. When b19 is at logic low, "resistor" mode is selected, and all ENs are at logic high. When b19 is at logic high, "leakage mode" is selected.

Figure 7:
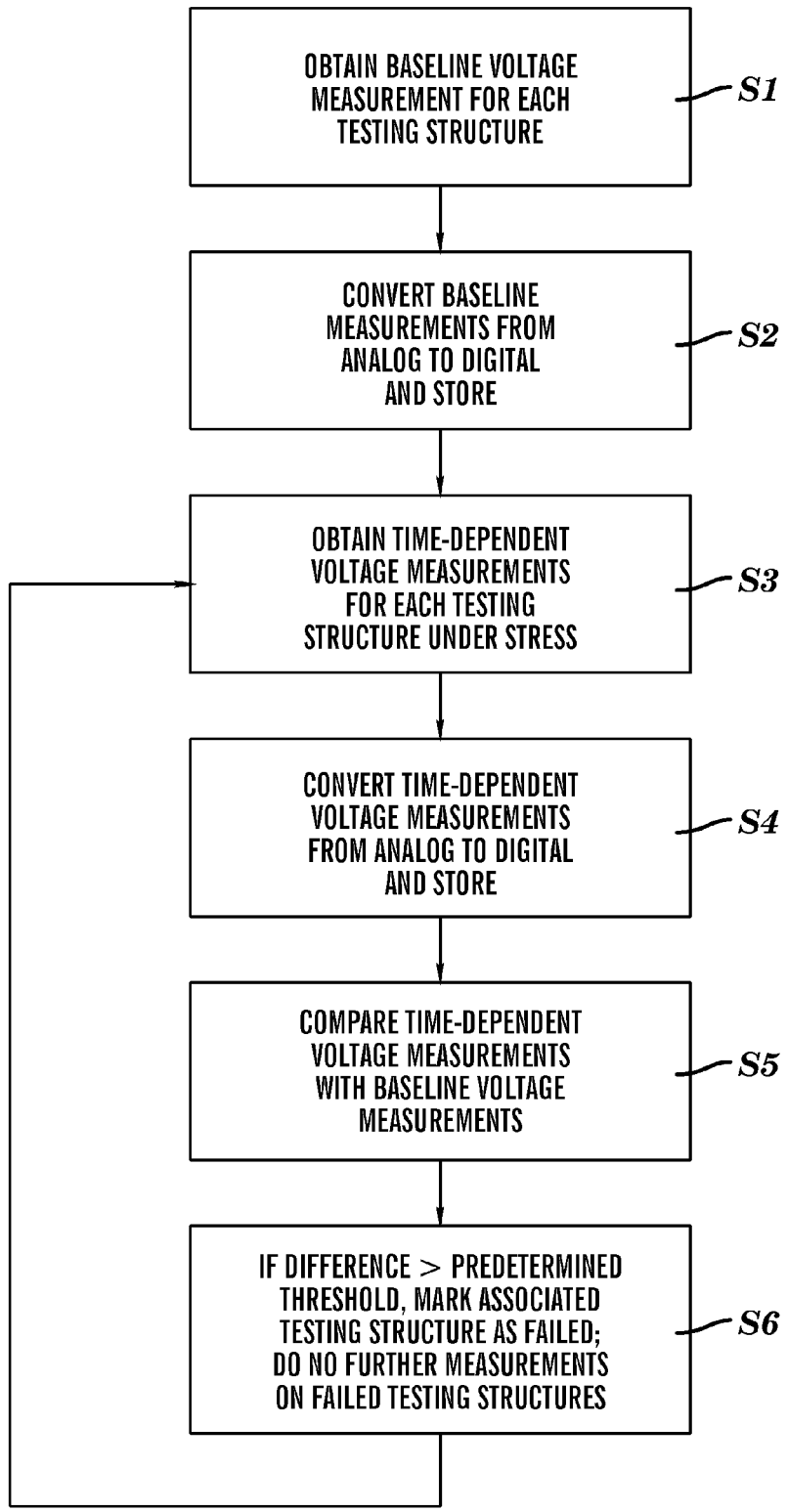
FIG. 7 depicts a flow diagram showing a methodology in accordance with an embodiment of the present invention.

FIG. 7 depicts an illustrative methodology for performing EM testing. At S1, obtain baseline voltage measurements for each testing structure. At S2, convert the baseline measurements from analog to digital and store the digital data. At S3, obtain time dependent voltage measurements for each testing structure under high temperature and constant current stress. At S4, covert the time-dependent measurements from analog to digital and store the data. Next, compare the time-dependent measurements for each testing structure with associated baseline measurements at S5, and if the values are different by more than a predetermined threshold, mark the testing structure as failed and do no further testing on the failed structure at S6. Continue testing as dictated by an implemented reliability plan.

Note that at wafer level testing with a multi-probe setup, only the first or second failure from one chip is needed for an accurate chip level EM projection to be obtained quickly. With two times Juse (Juse=two times the design manual's defined maximum allowable DC design current) and a 140° C. burn-in (BI) temperature, a two to three month stress test will translate into eight to ten year of projected lifetime.

The described embodiments can ensure whole chip reliability by providing millions of EM segments that can be operated under higher than normal current to account for all statistical variations. In addition, the detection circuit is more reliable than the EM resistors and the rest of chip to ensure that the detection circuit should not fail earlier than all the EM testing resistors. Variations induced by other factors such as temperature should not affect the monitor detection accuracy.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "computer" or "system." Furthermore, aspects of the present invention may take the form of a computer program product embodied in one or more computer readable medium(s) having computer readable program code embodied thereon.

What is claimed is:

1. A testing structure for monitoring electro-migration (EM) performance, comprising:
    an EM resistor having four point resistive measurement, wherein a first and a second terminal of the EM resistor provide current input and a third and a fourth terminal of the EM resistor provide a voltage measurement;
    a first PFET coupled to the first terminal of the EM resistor as a secondary side of a current mirror for supplying a test current;
    wherein the voltage measurement is obtained from a pair of switching transistors whose gates are controlled by a selection switch and whose drains are utilized to measure a voltage across the third and fourth terminals; and
    an inverter and two control PFETs coupled to the first PFET to allow the voltage measurement to be obtained while the first PFET is turned off and the selection switch is activated.

2. The testing structure of claim 1, wherein the selection switch selectively activates the current mirror to obtain the voltage measurement.

3. The testing structure of claim 2, wherein the voltage measurement is utilized to detect an EM resistance failure during manufacturing of an integrated circuit (IC).

4. The testing structure of claim 1, wherein the voltage measurement obtained while the first PFET is turned off and the selection switch is activated indicates a leakage between the EM resistor and a neighboring EM resistor in a neighboring testing structure.

5. A system for monitoring electro-migration (EM) performance, comprising:
    an array of testing structures, wherein each testing structure includes:
        an EM resistor having four point resistive measurement, wherein a first terminal and a second terminal provides current input and a third terminal and a fourth terminal provides a voltage measurement, the voltage measurement obtained from a pair of switching transistors whose gates are controlled by a selection switch and whose drains are utilized to measure a voltage across the third and fourth terminals; and
        a first transistor coupled to the first terminal of the EM resistor as a secondary side of a current mirror for supplying a test current;
    a decoder for selectively activating the selection switch for one of the testing structures in the array of testing structures; and
    a pair of outputs for outputting the voltage measurement of a selected testing structure.

6. The system of claim 5, wherein the selection switch selectively activates the current mirror of the selected testing structure to obtain the voltage measurement.

7. The system of claim 6, wherein the voltage measurement is utilized to detect an EM resistance failure during manufacturing of an integrated circuit (IC).

8. The system of claim 7, wherein each testing structure further comprises an inverter and two control transistors coupled to the first transistor to allow the voltage measurement to be obtained for a selected testing structure while the first transistor is turned off.

9. The system of claim 8, wherein the voltage measurement obtained while the first transistor is turned off determines a leakage between the EM resistor and a neighboring EM resistor in a neighboring testing structure within the array.

10. The system of claim 5, wherein a common Vdd is provided to each testing structure via a first pad and a common ground is provided to each testing structure via a second pad.

11. The system of claim 10, wherein a common current input is provided to each testing structure via a third pad.

12. The system of claim 5, further comprising:
    a microcontroller for reading the voltage measurement and converting the voltage measurement from an analog value to a digital value; and
    a computer for inputting the digital value.

13. A method for determining electro-migration (EM) reliability, comprising:
    providing a plurality of testing structures in an integrated circuit (IC), wherein each testing structure includes:
        an EM resistor having four point resistive measurement, wherein a first terminal and a second terminal provides current input and a third terminal and a fourth terminal provides a voltage measurement, the voltage measurement obtained from a pair of switching transistors whose gates are controlled by a selection switch and whose drains are utilized to measure a voltage across the third and fourth terminals; and
        a first transistor coupled to a first terminal of the EM resistor as a secondary side of a current mirror for supplying a test current;
    selectively activating the selection switch for each of the plurality of testing structures; and
    outputting the voltage measurement for each selected testing structure.

14. The method of claim 13, further comprising:
    collecting a baseline voltage measurement from each testing structure;
    converting each baseline voltage measurement from analog to digital and saving the baseline digital voltage measurement;
    collecting time-dependent voltage measurements during a stress period from each testing structure;
    converting each time-dependent voltage measurement from analog to digital and saving the digital voltage measurements; and
    comparing each time-dependent digital voltage measurement with an associated baseline digital voltage measurement for each testing structure.

15. The method of claim 14, further comprising:
    identifying a testing structure as "failed" in response to the time-dependent digital voltage measurement exceeding the associated baseline digital voltage measurement by a predetermined threshold.

16. The method of claim 15, further comprising skipping "failed" testing structures in future measurements.

17. The method of claim 13, wherein outputting the voltage measurement for each selected testing structure occurs during manufacturing of an integrated circuit (IC).

18. The method of claim 13, further comprising:
further providing each testing structure with an inverter and two control transistors coupled to the first transistor to allow a second type of voltage measurement to be obtained for a selected testing structure while the first transistor is turned off;
collecting the second type of voltage measurements for each of the plurality of testing structures with the first transistor turned off; and
determining a leakage between neighboring resistors based on the second type of voltage measurements collected for neighboring testing structures.

19. The method of claim 13, further comprising providing a microcontroller and a computer.

* * * * *